United States Patent
Jeong

(10) Patent No.: US 7,071,068 B2
(45) Date of Patent: Jul. 4, 2006

(54) TRANSISTOR AND METHOD FOR FABRICATING THE SAME

(75) Inventor: Jae Goan Jeong, Kyoungki-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 100 days.

(21) Appl. No.: 10/889,067

(22) Filed: Jul. 13, 2004

(65) Prior Publication Data
US 2004/0259313 A1    Dec. 23, 2004

Related U.S. Application Data

(62) Division of application No. 09/751,939, filed on Jan. 2, 2001, now Pat. No. 6,794,714.

(30) Foreign Application Priority Data
Dec. 31, 1999  (KR) .............................. 1999-67988

(51) Int. Cl.
  *H01L 21/336* (2006.01)
(52) U.S. Cl. ...................... 438/305; 438/303; 438/299; 438/592
(58) Field of Classification Search ............... 438/303, 438/305
  See application file for complete search history.

(56) References Cited

U.S. PATENT DOCUMENTS

| | | | |
|---|---|---|---|
| 5,777,370 A | 7/1998 | Omid-Zohoor et al. | |
| 5,856,227 A * | 1/1999 | Yu et al. | 438/305 |
| 5,950,090 A * | 9/1999 | Chen et al. | 438/296 |
| 6,001,697 A | 12/1999 | Chang et al. | |
| 6,017,784 A | 1/2000 | Ohta et al. | |
| 6,018,185 A | 1/2000 | Mitani et al. | |
| 6,063,680 A | 5/2000 | Wu | |
| 6,072,241 A | 6/2000 | Kojima | |
| 6,074,921 A | 6/2000 | Lin | |
| 6,077,748 A * | 6/2000 | Gardner et al. | 438/296 |
| 6,110,787 A * | 8/2000 | Chan et al. | 438/300 |
| 6,180,475 B1 | 1/2001 | Cheek et al. | |
| 6,194,299 B1 | 2/2001 | Buynoski | |
| 6,261,935 B1 | 7/2001 | See et al. | |
| 6,274,419 B1 | 8/2001 | Omid-Zohoor et al. | |

* cited by examiner

*Primary Examiner*—Zandra V. Smith
*Assistant Examiner*—Bac H. Au
(74) *Attorney, Agent, or Firm*—Pillsbury Winthrop Shaw Pittman LLP

(57) ABSTRACT

A transistor and a method for fabricating the same that involves a forming a device isolation oxide film semiconductor substrate, forming an opening in the device isolation oxide to open the substrate and define an active region, the junction between the oxide and the substrate having a rounded profile, and then forming a complex gate electrode structure in the active region. The preferred gate electrode structure comprises a gate oxide and a stacked conductor structure having a first and a second conductor, an optional hard mask layer formed on the second conductor, an oxide layer formed on the first conductor, and nitride spacers formed on the oxide layer on the sidewalls of the gate electrode. On either side of the gate electrode structure lightly doped drain (LDD) regions and source drain regions are then formed in the active region of the semiconductor substrate. The wafer is then planarized with one or more insulating films to condition the wafer for subsequent processing.

3 Claims, 14 Drawing Sheets

TRANSISTOR AND METHOD FOR FABRICATING THE SAME

This is a divisional application of U.S. patent application Ser. No. 09/751,939, filed on Jan. 2, 2001, now U.S. Pat. No. 6,794,714, the contents of which are incorporated herein by reference in their entirety.

BACKGROUND OF THE INVENTION

1. Field of the Invention

The present invention relates to an improved transistor and a method for fabricating the same that can improve electrical properties and manufacturing yield. The method disclosed includes forming a device isolation oxide film, etching the isolation oxide to form an active region, and forming a gate electrode within the active region.

2. Description of the Background Art

FIGS. 1 to 3 respectively illustrate a conventional transistor. Here, FIG. 1 is a layout diagram illustrating the transistor, FIG. 2 is a cross-sectional diagram illustrating the transistor, taken along line I—I in FIG. 1, and FIG. 3 is a cross-sectional diagram illustrating the transistor, taken along line II—II in FIG. 1.

As illustrated therein, the conventional transistor includes: a device isolation oxide film 14 formed in a device isolation region on a p-type semiconductor substrate 11; a gate electrode 16 formed by positioning a gate oxide film 15 on the semiconductor substrate 11; a lightly doped drain (LDD) region 17 formed in the active region on the semiconductor substrate 11 at both sides of the gate electrode 16; a second nitride film spacer 18 formed at both sides of the gate electrode 16; and a source/drain junction region 19 formed at both sides of the second nitride film spacer 18 and the gate electrode 16.

FIGS. 4a to 4d and 5a to 5d are cross-sectional diagrams illustrating sequential steps of a conventional method for fabricating the transistor.

Referring to FIGS. 4a and 5a, a device isolation region is defined according to a general shallow trench isolation (STI) method. A pad oxide film 12, a first nitride film 13 and a first photoresist film pattern are sequentially formed on the p-type semiconductor substrate 11. Here, the first photoresist film pattern is formed according to conventional exposure and development processes employing a device isolation mask.

Thereafter, the first nitride film 13, pad oxide film 12 and a portion of semiconductor substrate 11 are selectively etched using the first photoresist pattern as a mask to form a trench.

The first photoresist film pattern is removed, and the device isolation oxide film 14 is grown on the whole surface including the trench and then planarized utilizing a chemical mechanical polishing (CMP) or etchback process. The planarization process uses first nitride film 13 as planarization end point with sufficient overetch to ensure that the device isolation oxide film 14 remains only in the trench.

As illustrated in FIGS. 4b and 5b, a channel region (C) is formed on the semiconductor substrate 11 by removing the nitride film 13 and the pad oxide film 12 from the active area of semiconductor substrate 11, and implanting ions into the semiconductor substrate 11.

The gate oxide film 15 is then formed on the semiconductor substrate 11 utilizing a thermal oxidation process, and the gate electrode 16, preferably having a stacked structure with a polysilicon layer 16a and a tungsten layer 16b, is then formed on the gate oxide film 15.

A second photoresist film pattern is then formed on the tungsten layer 16b. Here, the photoresist film pattern is formed utilizing conventional exposure and development processes and a gate electrode mask.

The tungsten layer 16b, polysilicon layer 16a and gate oxide film 15 are then selectively etched using the second photoresist film pattern as a mask to form the gate electrode 16. The second photoresist film pattern is then removed.

As depicted in FIGS. 4c and 5c, a lightly doped n-type impurity ion implantation process is then performed using the gate electrode 16 as a mask. The implanted ions are then diffused using a drive-in process to form a lightly-doped drain region 17 on both sides of the gate electrode 16.

As shown in FIGS. 4d and 5d, the second nitride film is then formed on the whole surface including the gate electrode 16. The second nitride film spacer 18 is formed on the semiconductor substrate 11 at both sides of the gate electrode 16, by etching the second nitride film.

A highly doped n-type impurity ion implantation process is then performed using the gate electrode 16 and the second nitride film spacer 18 as a mask. The ions are diffused using drive-in process, thereby forming a source/drain junction region 19 at both sides of the gate electrode 16 including the second nitride film spacer 18.

However, the conventional transistor and the method for fabricating the same have the following disadvantages:

Firstly, the sidewalls of the device isolation oxide film are commonly damaged during the LOCOS process, STI process, ion implantation process and succeeding thermal treatment. Thus, a leakage current increases and the refresh properties of the DRAM deteriorate.

Secondly, the thickness of the gate oxide film may be smaller at the end portion of the active region than the center portion thereof because of a stepped portion from the device isolation oxide film. Accordingly, gate oxide integrity is damaged and a reverse narrow width effect is generated in the transistor. In phenomenon known as the "reverse narrow width effect", $V_T$ (threshold voltage) is lowered, breakdown voltage is reduced, and as a result, junction leakage current is increased.

SUMMARY OF THE INVENTION

Therefore, an object of the present invention is to provide a transistor that can prevent or suppress leakage currents, damage to the gate oxide integrity, and reverse narrow width effect, and a method for fabricating the same.

In order to achieve the above-described object of the present invention, there is provided a transistor: a device isolation oxide film that defines an active region on a semiconductor substrate. A gate electrode is provided in the active region with a gate oxide film positioned between the substrate and the gate electrode, the gate electrode having a stacked structure. The first gate electrode layer is approximately equal height to the height of the device isolation oxide film. A second gate electrode layer is subsequently formed on the upper portion of the gate electrode. A lightly doped drain (LDD) region provided in the active region at both sides of the gate electrode with a nitride film spacer positioned at the sidewalls of the device isolation oxide film and the gate electrode layer. A source/drain junction region is provided in the active region on both sides of the gate electrode with second and third oxide films filling in the active region between the first gate electrode and the device isolation oxide film.

There is also provided a method for fabricating a transistor, including the steps of: forming a device isolation oxide film to define an active region at the upper portion of a semiconductor substrate; forming a first gate electrode on a gate oxide film in the active region; forming a first oxide film on the surface of the first gate electrode; forming a lightly doped drain (LDD) region in the active region at both sides of the first gate electrode; forming an insulation film spacer at both sides of the first gate electrode and at the sidewalls of the device isolation film; forming a source/drain junction region on the semiconductor substrate at both sides of the first gate electrode including the insulation film spacer; forming second and third planarized oxide films between the first gate electrode including the insulation film spacer and the device isolation oxide film; and forming a gate electrode having a stacked structure with a first gate electrode, a second gate electrode and a hard mask layer.

BRIEF DESCRIPTION OF THE DRAWINGS

The present invention will become better understood with reference to the accompanying figures. These figures are provided only by way of illustration and thus should not be understood to unnecessarily limit the present invention, wherein.

DETAILED DESCRIPTION OF THE PREFERRED EMBODIMENTS

A transistor and a method for fabricating the same in accordance with the present invention will now be described in detail with reference to the accompanying figures.

Figure 1:
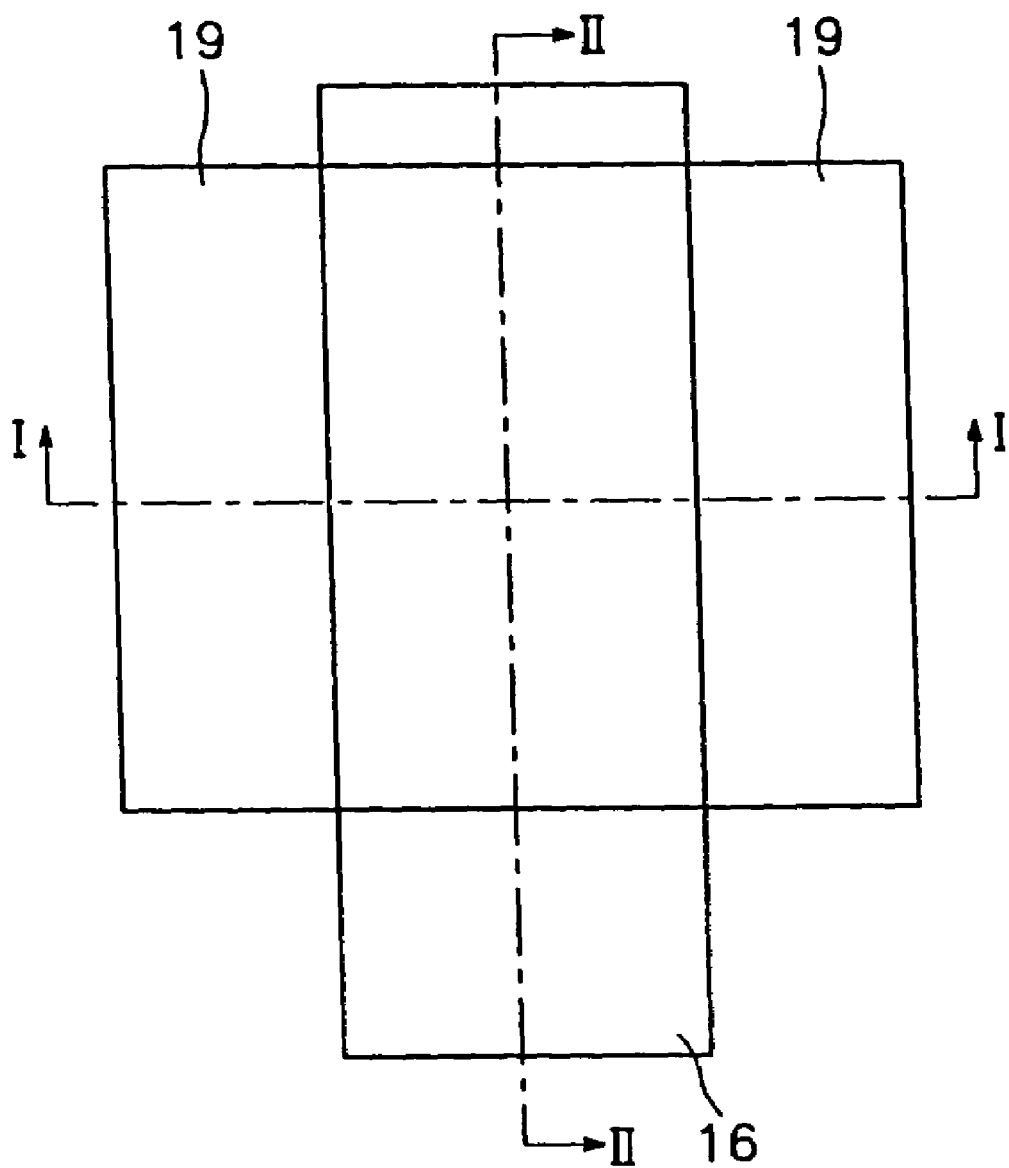
FIG. 1 is a layout diagram illustrating a conventional transistor.
Figure 2:
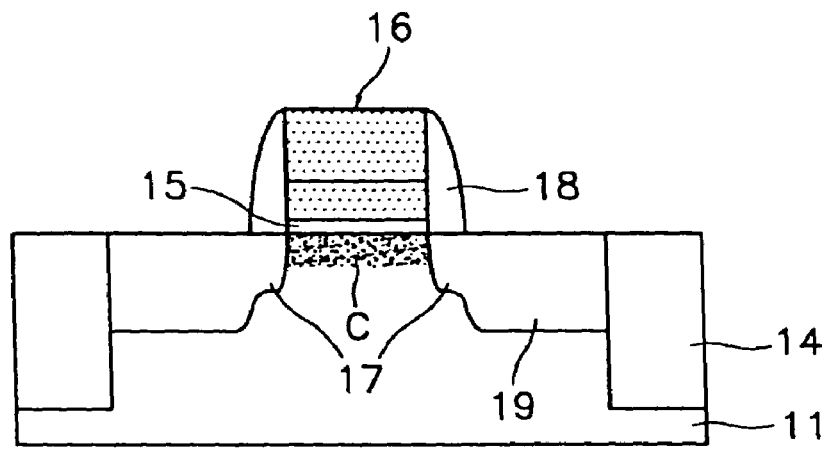
FIG. 2 is a cross-sectional diagram illustrating the transistor, taken along line I—I in FIG. 1.
Figure 3:
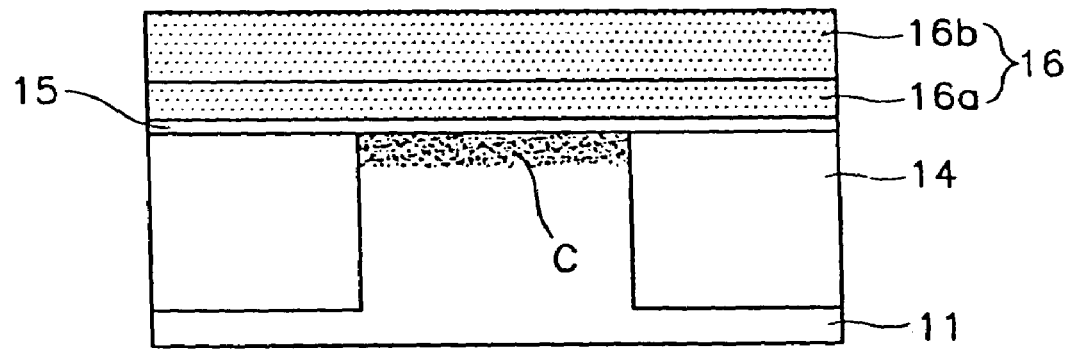
FIG. 3 is a cross-sectional diagram illustrating the transistor, taken along line II—II in FIG. 1.
Figure 4A:
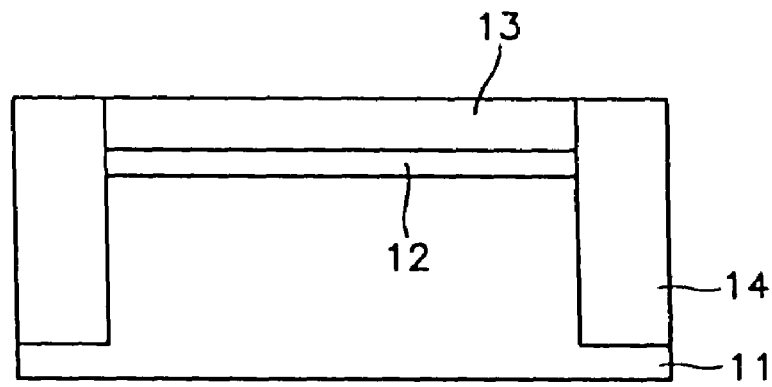
FIGS. 4a to 4d are cross-sectional diagrams illustrating sequential steps of a conventional method for fabricating the transistor, taken along line I—I in FIG. 1.
Figure 4B:
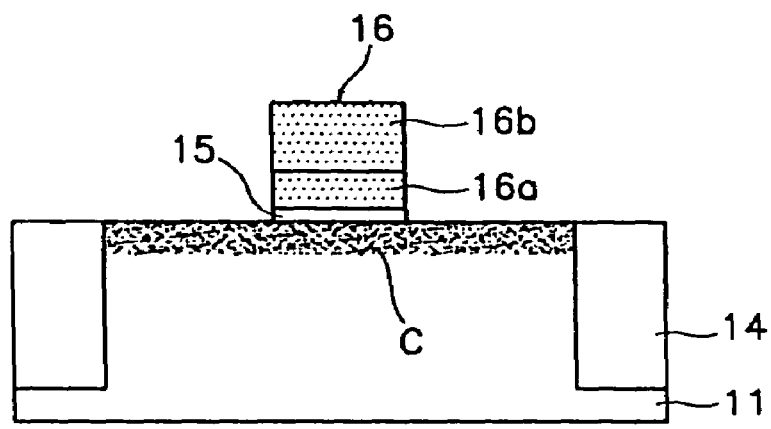
Figure 4C:
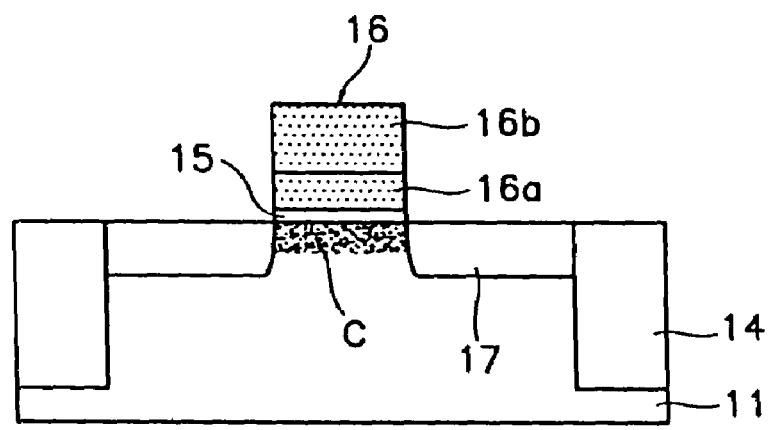
Figure 4D:
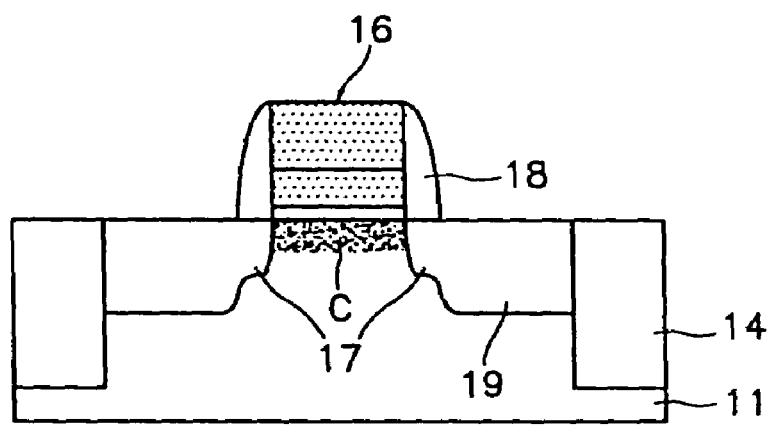
Figure 5A:
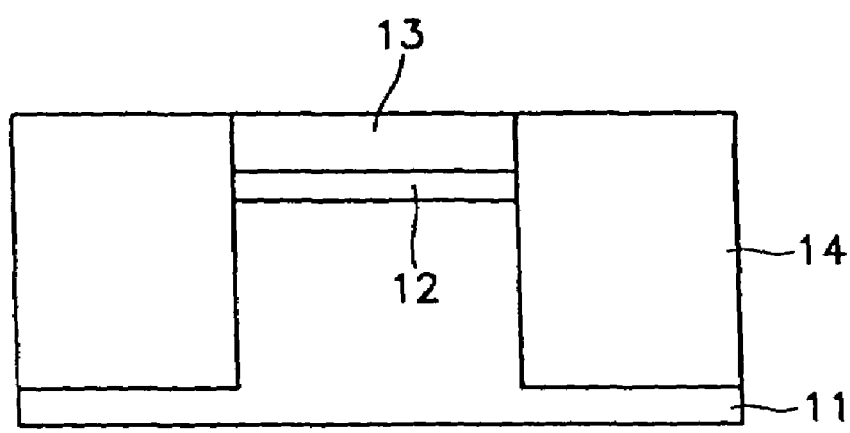
FIGS. 5a to 5d are cross-sectional diagrams illustrating the sequential steps of the conventional method for fabricating the transistor, taken along line II—II in FIG. 1.
Figure 5B:
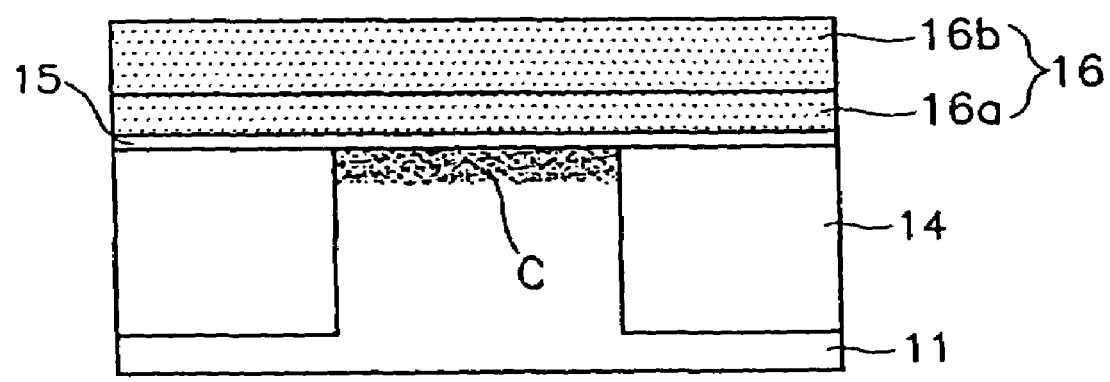
Figure 5C:
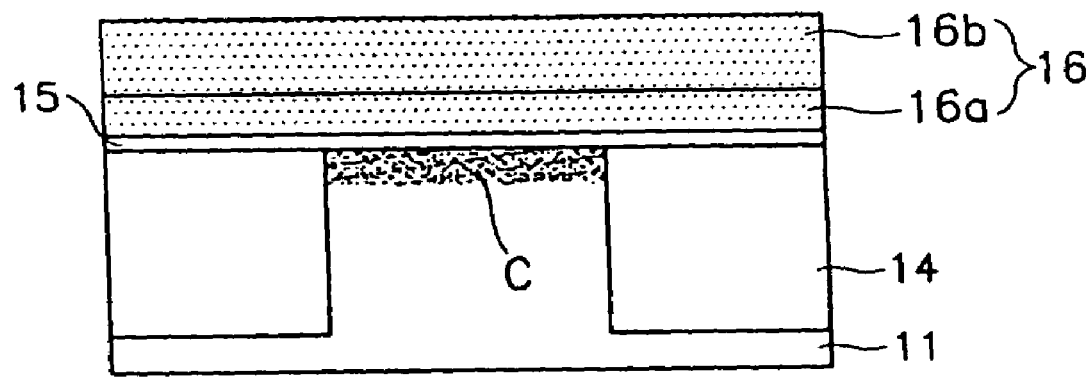
Figure 5D:
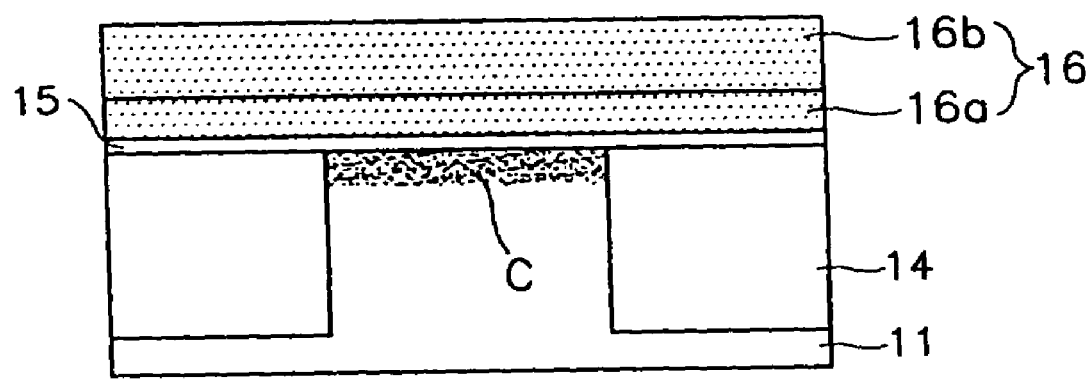
Figure 6:
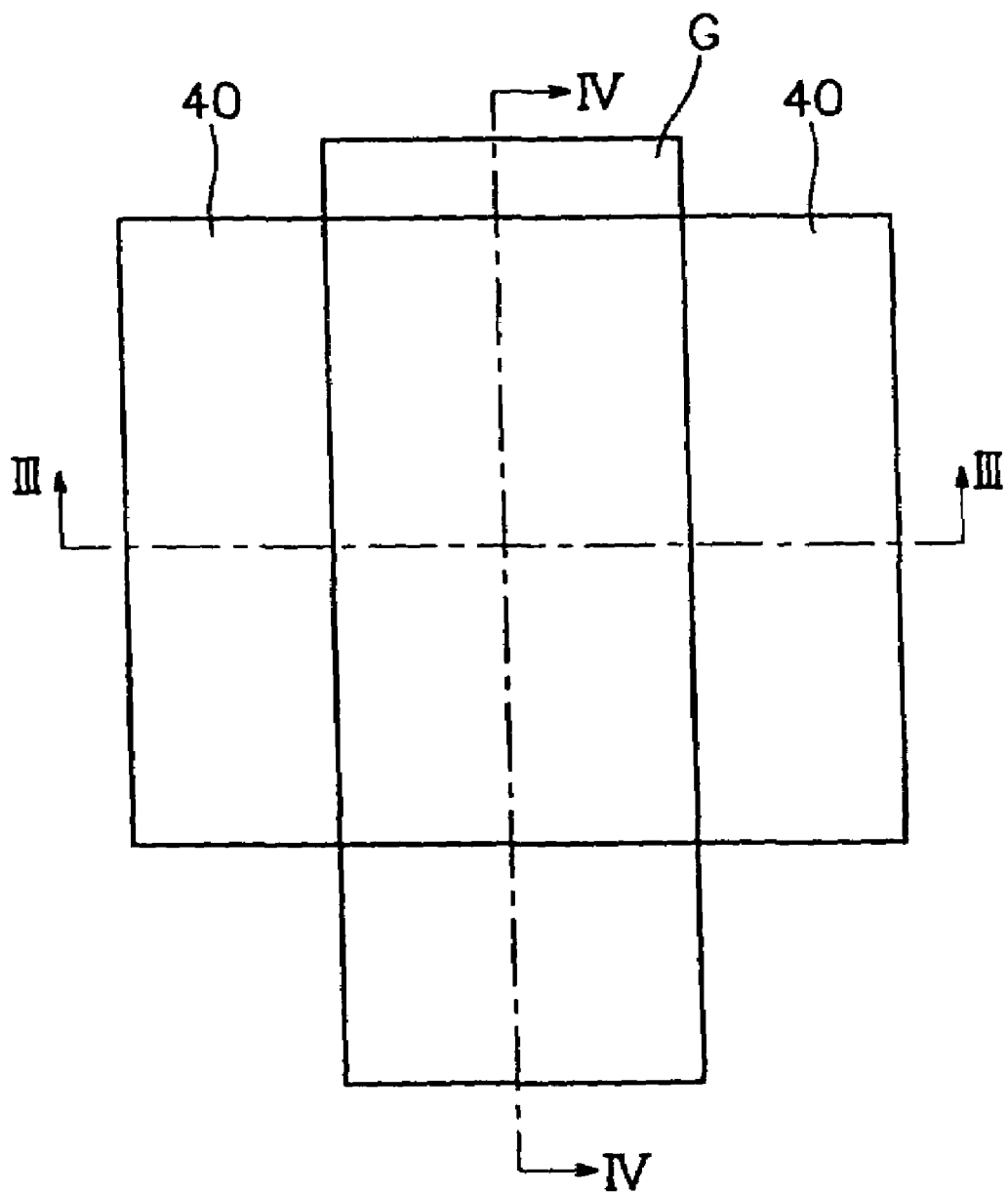
FIG. 6 is a layout diagram illustrating a transistor in accordance with a preferred embodiment of the present invention.
Figure 7:
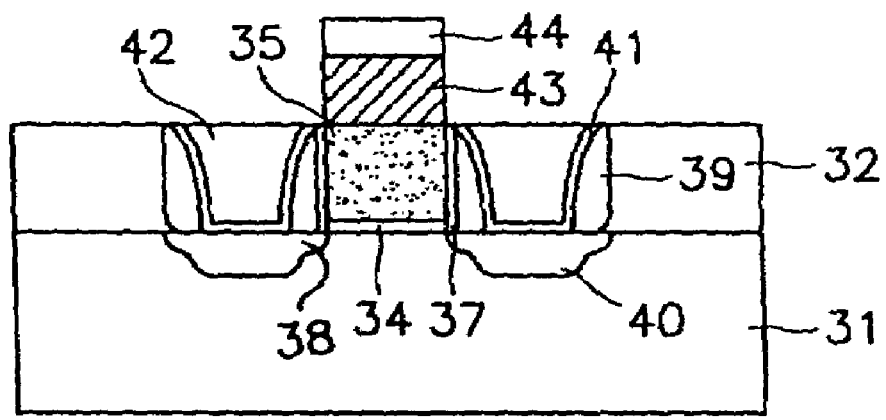
FIG. 7 is a cross-sectional diagram illustrating the transistor, taken along line III—III in FIG. 6.
Figure 8:
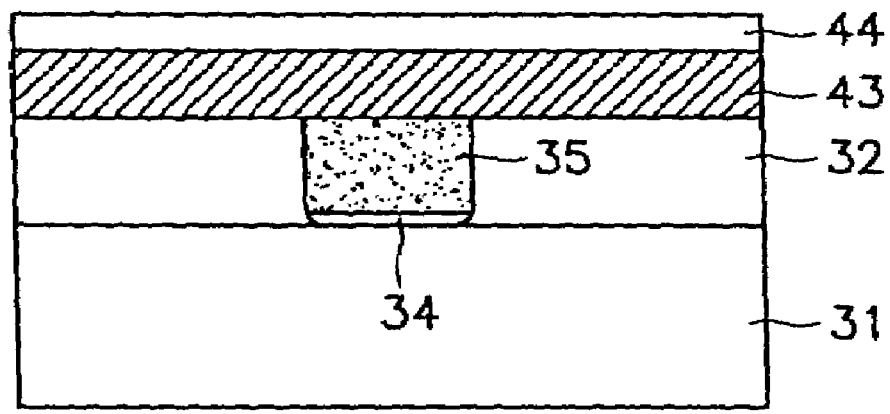
FIG. 8 is a cross-sectional diagram illustrating the transistor, taken along line IV—IV in FIG. 6.

FIGS. 6 to 8 illustrate the transistor according to the present invention. FIG. 7 is a cross-sectional diagram illustrating the transistor, taken along line III—III in FIG. 6, and FIG. 8 is a cross-sectional diagram illustrating the transistor, taken along line IV—IV in FIG. 6.

As illustrated in FIGS. 6 to 8, the transistor includes: a semiconductor substrate 31; a device isolation oxide film 32 for defining an opening 100 which corresponds to an active region; the gate electrode has a stacked structure comprising first gate electrode 35 positioned on gate oxide film 34 that had been formed on the semiconductor substrate 31, and a second electrode 43 formed on the first gate electrode 35; a lightly doped drain (LDD) region 38 formed in the active region of the semiconductor substrate 31 at both sides of the gate electrode; a nitride film spacer 39 formed at both sides of the gate electrode and at the sidewalls of the device isolation oxide film 32; a source/drain junction region 40 formed in the active region of the semiconductor substrate 31 at both sides of the gate electrode including the nitride film spacer 39; and second and third oxide films 41, 42 provided on the nitride film spacer 39.

Preferably, the lower portion of the groove 100 consists of the semiconductor substrate 31.

FIGS. 9a to 9f and 10a to 10f are cross-sectional diagrams illustrating sequential steps of a method for fabricating the transistor in accordance with the present invention.

Figure 9A:
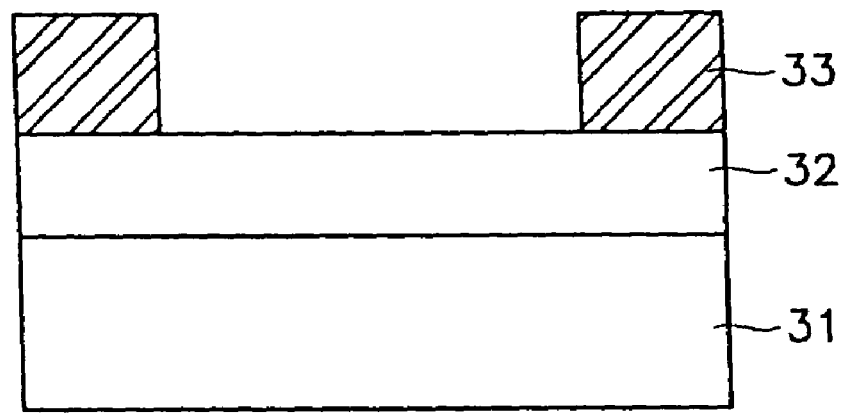
FIGS. 9a to 9f are cross-sectional diagrams illustrating sequential steps of a method for fabricating the transistor, taken along line III—III in FIG. 6.
Figure 10A:
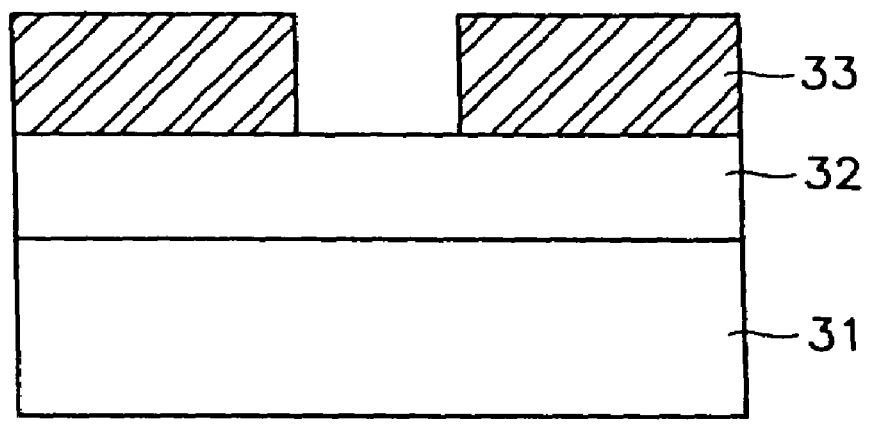
FIGS. 10a to 10f are cross-sectional diagrams illustrating the sequential steps of the method for fabricating the transistor, taken along line IV—IV in FIG. 6.

Referring to FIGS. 9a and 10a, the device isolation oxide film 32 and first photoresist film pattern 33 are formed on the p-type semiconductor substrate 31. Here, the first photoresist film pattern 33 is formed to cover a device isolation region.

After forming the device isolation oxide film 32 well ions, field stop ions and threshold voltage ($V_t$) control ions are implanted into the whole surface, and then the first photoresist film pattern 33 is formed.

Figure 9B:
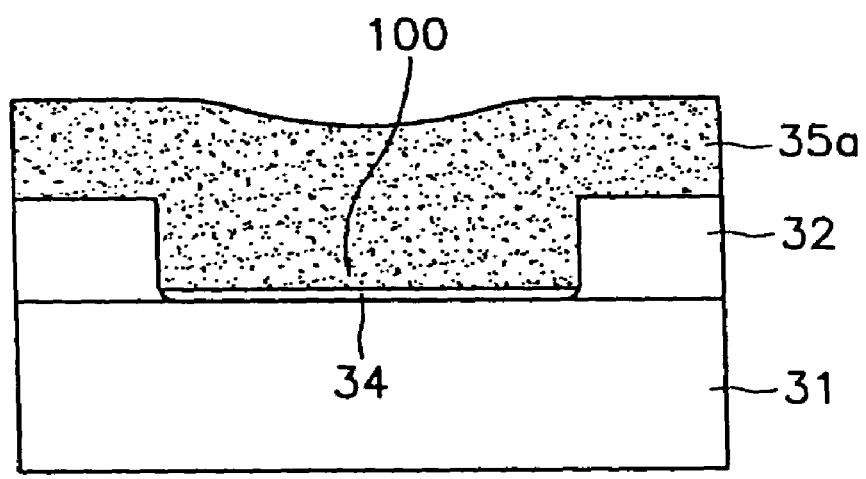
Figure 10B:
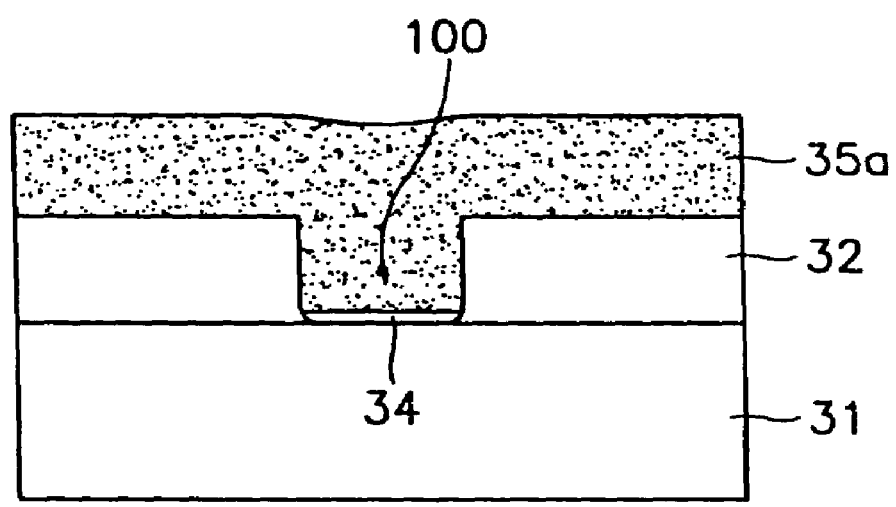

As shown in FIGS. 9b and 10b, the opening 100 for exposing the active region of the semiconductor substrate 31 is formed by selectively etching the device isolation oxide film 32 using the first photoresist film pattern 33 as a mask.

Here, the device isolation oxide film 32 is etched so that the bottom edges of the opening 100 can be rounded, thereby preventing subsequent damage to the gate oxide integrity and reverse narrow width effects from affecting the resulting transistor.

Thereafter, the first photoresist film pattern 33 is removed, and a gate oxide film 34 is grown on the exposed semiconductor substrate 31.

A first polysilicon layer 35a is formed on the whole surface of the semiconductor substrate 31 including the opening 100.

Figure 9C:
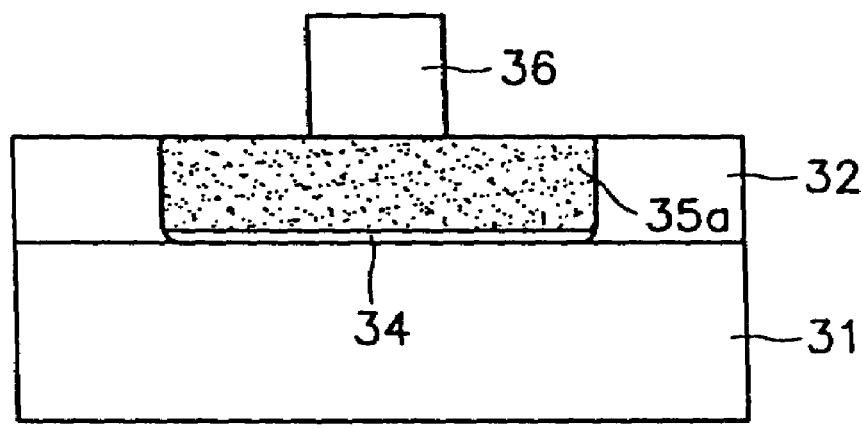
Figure 10C:
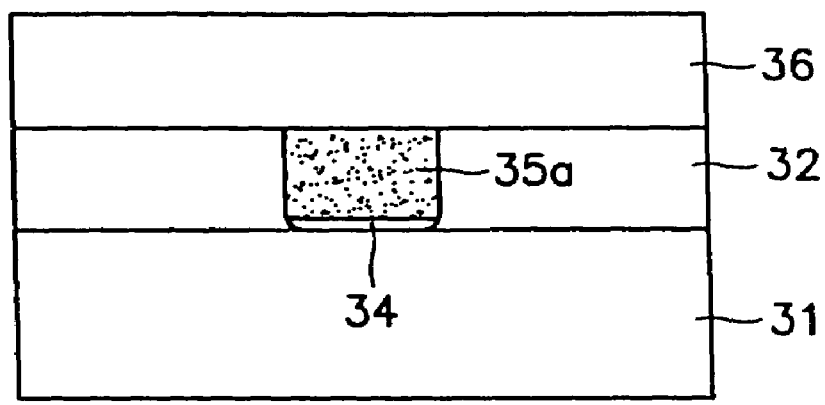

As illustrated in FIGS. 9c and 10c, the first polysilicon layer 35a is planarized utilizing a chemical mechanical polishing (CMP) process using the exposure of the device isolation oxide film 32 as an end point. A second photoresist film pattern 36 is then formed on the first polysilicon layer 35a. Here, the second photoresist film pattern 36 is formed using conventional exposure and development processes and a gate electrode mask.

Figure 9D:
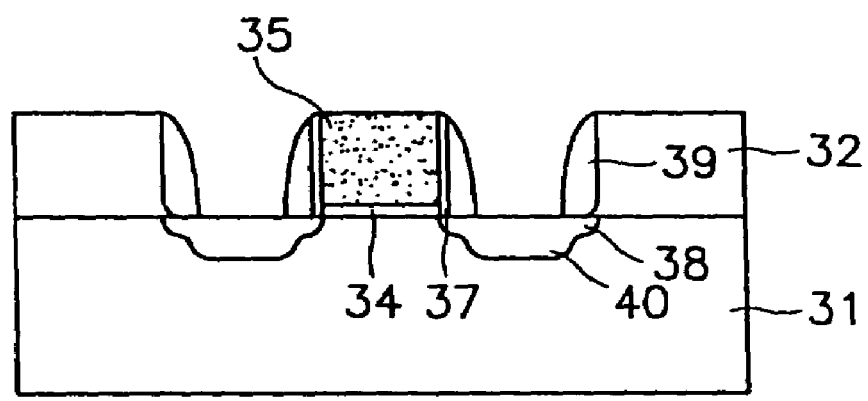
Figure 10D:
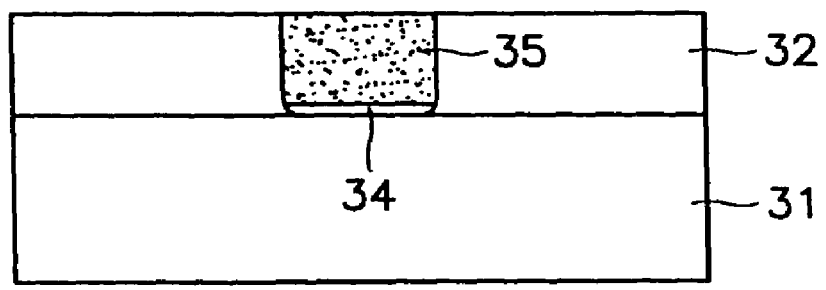

As depicted in FIGS. 9d and 10d, the first gate electrode 35 is then formed by selectively etching the first polysilicon layer 35a using the second photoresist film pattern 36 as a mask. Thereafter, the second photoresist film pattern 36 is removed.

A first oxide film 37 is grown on the first gate electrode 35 by thermally oxidizing the first gate electrode 35. A lightly doped n-type impurity ion implantation process is performed on the semiconductor substrate 31 using the device isolation oxide film 32 and the first gate electrode 35 as masks. Ions are diffused using a drive-in process to form the LDD region 38 in the active region on the semiconductor substrate 31 at both sides of the first gate electrode 35.

A nitride film is then formed on the whole surface. The nitride film spacer 39 is formed at both sides of the first gate electrode 35 and at the sidewalls of the device isolation oxide film 32, by etching back the nitride film.

A highly doped n-type impurity ion implantation process is carried out by using the first gate electrode 35 and the nitride film spacer 39 as a mask. Ions are diffused using a drive-in process to form the source/drain junction region 40 in the active region on the semiconductor substrate 31 at both sides of the first gate electrode 35 including the nitride film spacer 39.

Figure 9E:
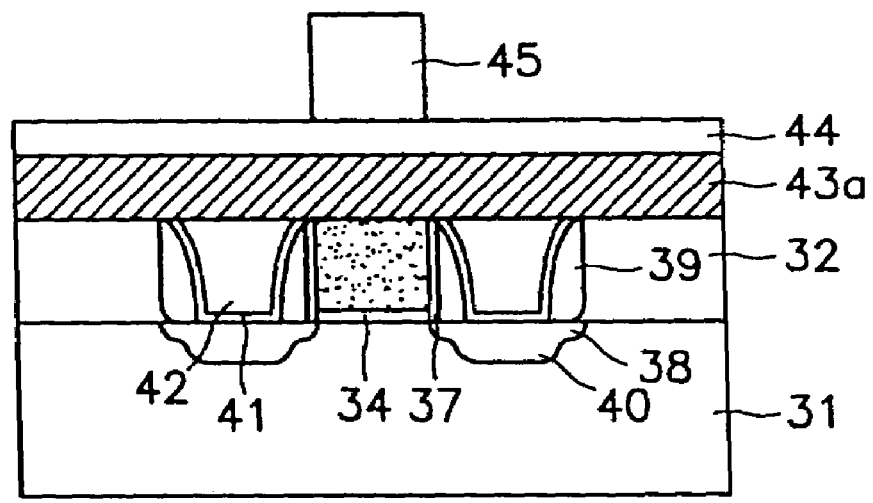
Figure 10E:
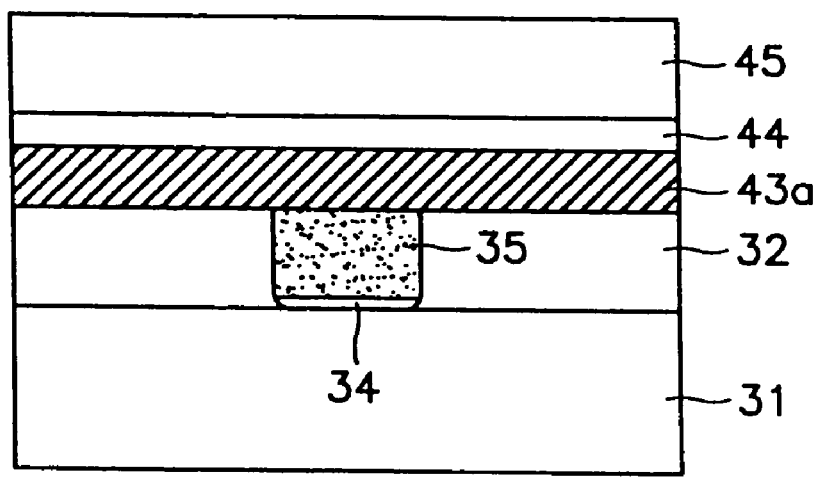

As shown in FIGS. 9e and 10e, the second and third oxide films 41, 42 are then formed on the whole surface, including the nitride film spacer 39, and planarized using the CMP process to expose the first gate electrode 35, again using the exposure of the device isolation oxide film 32 as an end point.

A second polysilicon layer 43a, a hard mask layer 44 and a third photoresist film pattern 45 are then stacked on the planarized surface. Here, the third photoresist film pattern 45 is formed using conventional exposure and development processes and again using the gate electrode mask.

Figure 9F:
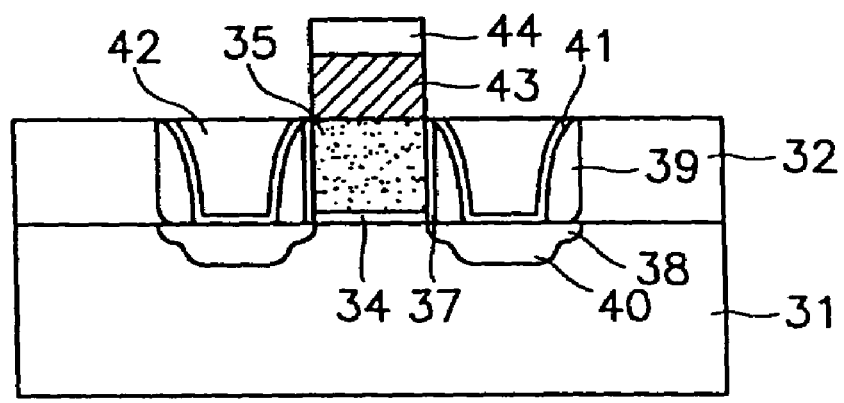
Figure 10F:
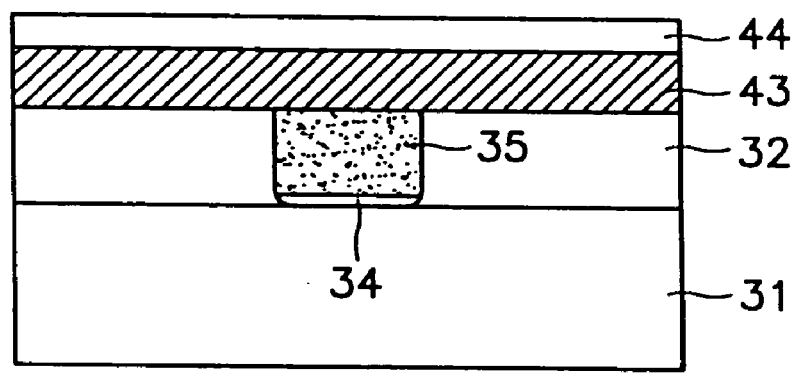

Referring to FIGS. 9f and 10f, a second gate electrode 43 is formed by selectively etching the hard mask layer 44 and the second polysilicon layer 43a using the third photoresist film pattern 45 as a mask. The resulting gate electrode has a stacked structure comprising the first gate electrode 35, second gate electrode 43 and hard mask layer 44. The third photoresist film pattern 45 is then removed.

As described above, the gate electrode consists of the first and second gate electrodes 35, 43. As shown in FIG. 10f, the first and second gate electrodes 35, 43 form a T shape.

As discussed earlier, the transistor and the method for fabricating the same in accordance with the present invention fabricate the gate electrode by forming the device isolation oxide film and etching the active region, and thus prevents a leakage current of the source/drain in the LOCOS or STI process, improves the refresh properties of the resulting DRAM, prevents damage to the gate oxide film, and decreases the reverse narrow width effect, junction leakage current and damage to the gate oxide integrity. As a result, the device properties and yield are improved.

As the present invention may be embodied in several forms without departing from the spirit or essential characteristics thereof, it should also be understood that the above-described embodiment is not necessarily limited to the particular details of the foregoing description, unless otherwise specified, but rather should be construed broadly within its spirit and scope as defined in the appended claims. Therefore, all changes and modifications that fall within the metes and bounds of the claims, or equivalences of such metes and bounds are intended to be embraced by the appended claims.

What is claimed is:

1. A method for fabricating a transistor, comprising:
    forming a device isolation oxide film for defining a groove which corresponds to an active region at the upper portion of a semiconductor substrate;
    forming a gate oxide film in a central portion of the active region of the semiconductor substrate, wherein the gate oxide film is separated from the device isolation film;
    forming a first gate electrode on the gate oxide film;
    forming a first oxide film at side walls of the first gate electrode;
    forming a lightly doped drain (LDD) region in the active region at both sides of the first gate electrode;
    forming nitride spacers at both sides of the first gate electrode and at side walls of the device isolation film;
    forming a source/drain junction region in the semiconductor substrate at both sides of the first gate electrode including the nitride spacers;
    forming a second oxide film and a planarized third oxide film between the first gate electrode and the device isolation film, wherein the third oxide film fills the space over the active region between the first gate electrode and the device isolation film; and
    forming a gate electrode having a stacked structure of the first gate electrode, a second gate electrode and a hard mask layer, by forming the second gate electrode and the hard mask layer on the first gate electrode.

2. The method according to claim 1, wherein the first gate electrode and the second gate electrode comprise polysilicon.

3. The method according to claim 1, wherein the first gate electrode comprises polysilicon and further wherein the first oxide film is formed by thermally oxidizing the first gate electrode.

* * * * *